(12) United States Patent
Yeh

(10) Patent No.: US 12,432,952 B2
(45) Date of Patent: Sep. 30, 2025

(54) III-V COMPOUND SEMICONDUCTOR FIELD-EFFECT TRANSISTOR GATE STRUCTURE COMPRISING A FIELD PLATE WITH CURVED SIDEWALLS AND MANUFACTURING METHOD THEREOF

(71) Applicant: UNITED MICROELECTRONICS CORP., Hsin-Chu (TW)

(72) Inventor: Chih-Tung Yeh, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 504 days.

(21) Appl. No.: 17/950,113

(22) Filed: Sep. 22, 2022

(65) Prior Publication Data

US 2024/0072154 A1 Feb. 29, 2024

(30) Foreign Application Priority Data

Aug. 29, 2022 (TW) .................................. 111132468

(51) Int. Cl.
*H10D 30/01* (2025.01)
*H10D 30/47* (2025.01)
*H10D 62/85* (2025.01)
*H10D 64/00* (2025.01)

(52) U.S. Cl.
CPC ......... *H10D 30/015* (2025.01); *H10D 30/475* (2025.01); *H10D 62/8503* (2025.01); *H10D 64/111* (2025.01)

(58) Field of Classification Search
CPC ............... H10D 30/015; H10D 30/475; H10D 62/8503; H10D 64/111; H10D 64/01; H10D 62/343; H10D 30/47
See application file for complete search history.

(56) References Cited

U.S. PATENT DOCUMENTS

| 11,322,600 | B2 | 5/2022 | Liu | |
|---|---|---|---|---|
| 2004/0051151 | A1* | 3/2004 | Dang | H10D 30/6715 257/E29.147 |
| 2005/0101044 | A1* | 5/2005 | Cho | H10D 86/441 438/30 |
| 2006/0060871 | A1 | 3/2006 | Beach | |
| 2008/0308813 | A1* | 12/2008 | Suh | H10D 30/4755 257/E29.127 |
| 2010/0244018 | A1* | 9/2010 | Kaneko | H10D 64/511 257/E21.403 |
| 2011/0250747 | A1* | 10/2011 | Son | H10B 41/30 257/E21.422 |

(Continued)

*Primary Examiner* — William B Partridge
*Assistant Examiner* — Ilker Ozden
(74) *Attorney, Agent, or Firm* — Winston Hsu

(57) ABSTRACT

A semiconductor device includes a substrate, a III-V compound semiconductor layer, a gate structure, a drain structure, and a field plate. The III-V compound semiconductor layer is disposed on the substrate. The gate structure, the drain structure, and the field plate are disposed above the III-V compound semiconductor layer. The field plate is located between the gate structure and the drain structure. The field plate includes a first curved sidewall located at an edge of the field plate adjacent to the drain structure. The first curved sidewall of the field plate may be used to improve electric field distribution in the semiconductor device, and electrical performance of the semiconductor device may be enhanced accordingly.

14 Claims, 3 Drawing Sheets

(56) References Cited

U.S. PATENT DOCUMENTS

| | | | |
|---|---|---|---|
| 2016/0181413 A1* | 6/2016 | Fujita | H10D 30/0287 |
| | | | 257/329 |
| 2017/0263724 A1* | 9/2017 | Kodera | H10D 8/411 |
| 2020/0235218 A1* | 7/2020 | Stoffels | H10D 30/6738 |
| 2020/0295144 A1* | 9/2020 | Sasaki | H10D 64/111 |
| 2021/0083073 A1* | 3/2021 | Liu | H10D 64/112 |
| 2021/0175343 A1* | 6/2021 | Chen | H10D 30/4732 |
| 2022/0020857 A1* | 1/2022 | Constant | H10D 30/015 |
| 2022/0302291 A1* | 9/2022 | Guo | H10D 30/47 |
| 2022/0336615 A1* | 10/2022 | Chiu | H01L 23/5283 |
| 2022/0376061 A1* | 11/2022 | Zhao | H01L 23/3192 |

\* cited by examiner

III-V COMPOUND SEMICONDUCTOR FIELD-EFFECT TRANSISTOR GATE STRUCTURE COMPRISING A FIELD PLATE WITH CURVED SIDEWALLS AND MANUFACTURING METHOD THEREOF

BACKGROUND OF THE INVENTION

1. Field of the Invention

The present invention relates to a semiconductor device and a manufacturing method thereof, and more particularly, to a semiconductor device including a III-V compound semiconductor layer and a manufacturing method thereof.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and heterojunction is formed at the junction between the semiconductor materials as a channel for carriers. In recent years, gallium nitride (GaN) based materials have been applied in the high power and high frequency products because of the properties of wider bandgap and high saturation velocity. Two-dimensional electron gas (2DEG) may be generated by the piezoelectricity property of the GaN-based materials, and the switching velocity may be enhanced because of the higher electron velocity and the higher electron density of the 2DEG. Therefore, how to further improve the electrical performance of transistors formed with III-V compound materials by modifying materials, structures and/or manufacturing methods has become a research direction for people in the related fields.

SUMMARY OF THE INVENTION

A semiconductor device and a manufacturing method thereof are provided in the present invention. A field plate including a curved sidewall is used to improve electric field distribution in the semiconductor device, and electrical performance of the semiconductor device may be enhanced accordingly.

According to an embodiment of the present invention, a semiconductor device is provided. The semiconductor device includes a substrate, a III-V compound semiconductor layer, a gate structure, a drain structure, and a field plate. The III-V compound semiconductor layer is disposed on the substrate. The gate structure, the drain structure, and the field plate are disposed above the III-V compound semiconductor layer. The field plate is located between the gate structure and the drain structure, and the field plate includes a first curved sidewall located at an edge of the field plate adjacent to the drain structure.

According to an embodiment of the present invention, a manufacturing method of a semiconductor device is provided. The manufacturing method includes the following steps. A III-V compound semiconductor layer is formed on a substrate. A gate structure, a field plate, and a drain structure are formed above the III-V compound semiconductor layer. The field plate is located between the gate structure and the drain structure, and the field plate includes a first curved sidewall located at an edge of the field plate adjacent to the drain structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
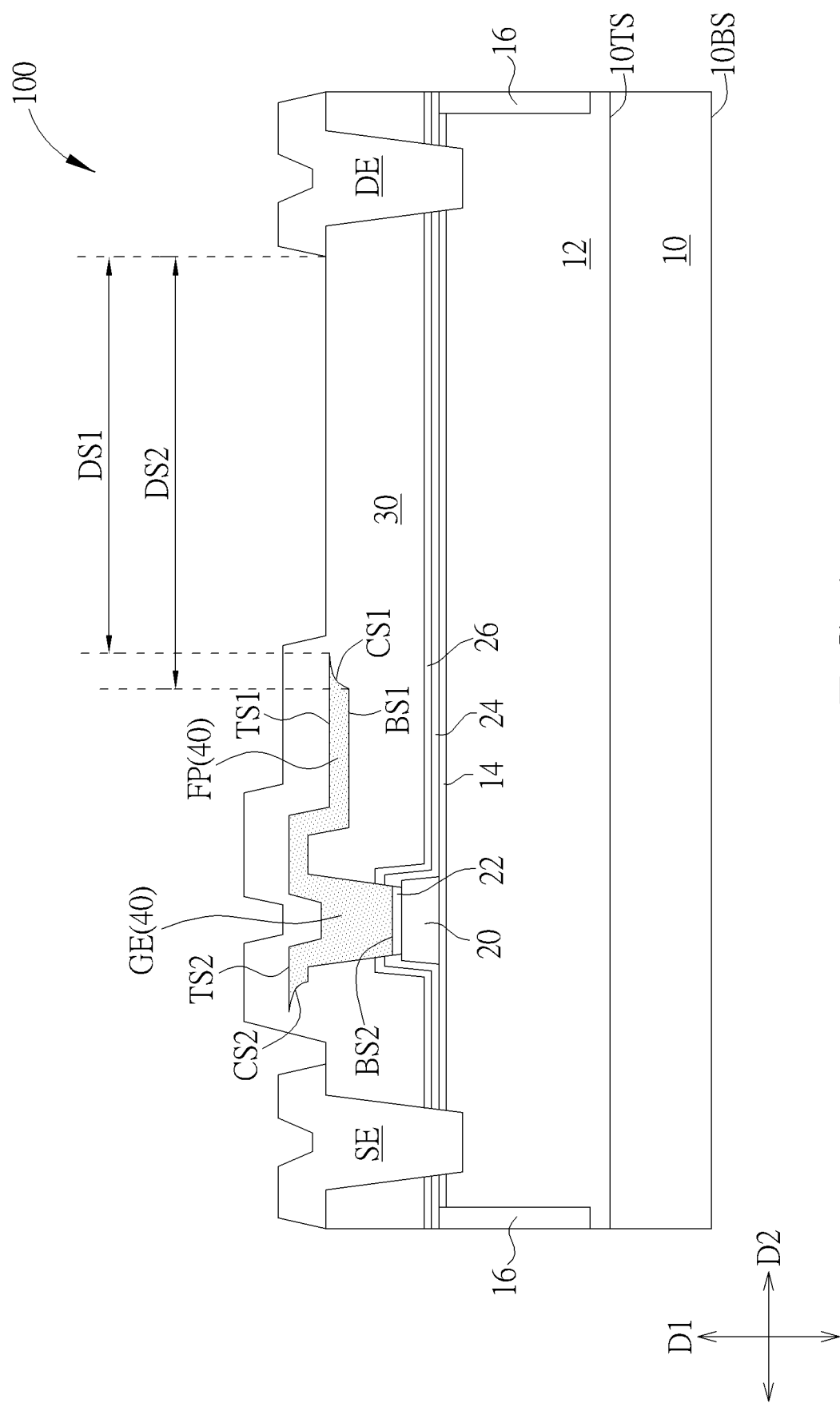
FIG. 1 is a schematic drawing illustrating a semiconductor device according to an embodiment of the present invention.

Please refer to FIG. 1. FIG. 1 is a schematic drawing illustrating a semiconductor device 100 according to an embodiment of the present invention. As shown in FIG. 1, the semiconductor device 100 includes a substrate 10, a III-V compound semiconductor layer 12, a gate structure GE, a drain structure DE, and a field plate FP. The III-V compound semiconductor layer 12 is disposed on the substrate 10. The gate structure GE, the drain structure DE, and the field plate FP are disposed above the III-V compound semiconductor layer 12. The field plate FP is located between the gate structure GE and the drain structure DE, and the field plate FP includes a first curved sidewall CS1 located at an edge of the field plate FP adjacent to the drain structure DE. The first curved sidewall CS1 of the field plate FP may be used to improve electric field distribution in the semiconductor device 100. For example, problems, such as corona effect, may be improved, and the electrical performance of the semiconductor device 100 may be enhanced accordingly.

Specifically, in some embodiments, the substrate 10 may have a top surface 10TS and a bottom surface 10BS opposite to the top surface 10TS in a vertical direction (such as a direction D1 illustrated in FIG. 1), and the III-V compound semiconductor layer 12, the gate structure GE, the drain structure DE, and the field plate FP may be disposed at a side of the top surface 10TS. In some embodiments, the direction D1 may be regarded as a thickness direction of the substrate 10, and horizontal directions substantially orthogonal to the direction D1 (such as a direction D2 and other directions orthogonal to the direction D1) may be substantially parallel with the top surface 10TS and/or the bottom surface 10BS of the substrate 10, but not limited thereto. In this description, a distance between the bottom surface 10BS of the substrate 10 and a relatively higher location and/or a relatively higher part in the vertical direction (such as the direction D1) may be greater than a distance between the bottom surface 10BS of the substrate 10 and a relatively lower location and/or a relatively lower part in the direction D1. The bottom or a lower portion of each component may be closer to the bottom surface 10BS of the substrate 10 in the direction D1 than the top or upper portion of this component. Another component disposed above a specific component may be regarded as being relatively far from the bottom surface 10BS of the substrate 10 in the direction D1, and another component disposed under a specific component may be regarded as being relatively close to the bottom surface 10BS of the substrate 10 in the direction D1.

Figure 5:
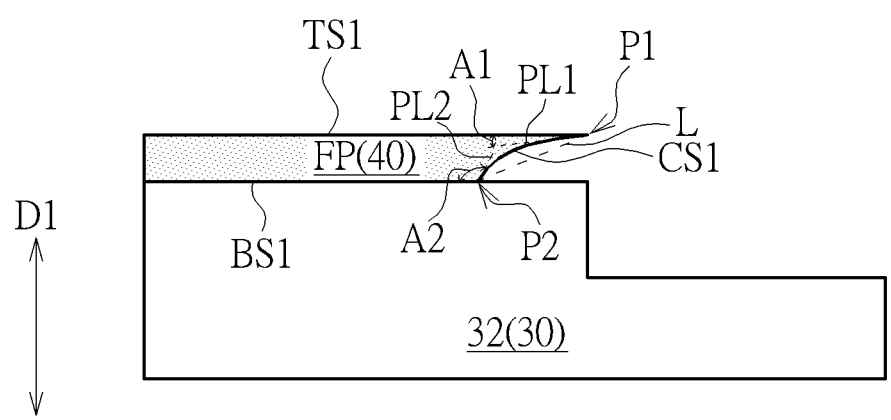

In some embodiments, the field plate FP in the semiconductor device 100 may be used to deplete the two-dimensional electron gas (2DEG) located under an area covered by the field plate FP for lowering the electric field under the off-state, and the field plate FP may be used to modify the electric field distribution for enhancing breakdown voltage and/or suppressing current collapse. In some embodiments, the field plate FP illustrated in FIG. 5 may be regarded as a partially enlarged schematic drawing of the field plate FP illustrated in FIG. 1. As shown in FIG. 1 and FIG. 5, the first curved sidewall CS1 of the field plate FP may be concave towards a top surface TS1 of the field plate FP, the first curved sidewall CS1 may be directly connected with the top surface TS1 of the field plate FP at a first portion P1 of the field plate FP, and the first curved sidewall CS1 may be directly connected with a bottom surface BS1 of the field plate FP at a second portion P2 of the field plate FP. In other words, the first portion P1 of the field plate FP may include a portion where the first curved sidewall CS1 is directly connected with the top surface TS1, and the second portion P2 of the field plate FP may include a portion where the first curved sidewall CS1 is directly connected with the bottom surface BS1 of the field plate FP. In some embodiments, the top surface TS1 may be regarded as the topmost surface of the field plate FP in the direction D1, the bottom surface BS1 may be regarded as the bottommost surface of the field plate FP in the direction D1, the first portion P1 may be regarded as the topmost portion of the edge of the field plate FP located adjacent to the drain structure DE in the direction D1, and the second portion P2 may be regarded as the bottommost portion of the edge of the field plate FP located adjacent to the drain structure DE in the direction D1, but not limited thereto. Additionally, the portion where the first curved sidewall CS1 is directly connected with the top surface TS1 and the portion where the first curved sidewall CS1 is directly connected with the bottom surface BS1 may be located at a straight line L, and the straight line L may be located under the first curved sidewall CS1 in the direction D1 because the first curved sidewall CS1 is concave towards the top surface TS1 of the field plate FP.

In some embodiments, an included angle between the top surface TS1 and the first curved sidewall CS1 may be less than an included angle between the bottom surface BS1 and the first curved sidewall CS1, and a distance DS1 between the first portion P1 of the field plate FP and the drain structure DE in a horizontal direction (such as the direction D2) may be less than a distance DS2 between the second portion P2 of the field plate FP and the drain structure DE in the direction D2. In some embodiments, the included angle between the top surface TS1 and the first curved sidewall CS1 may include an included angle A1 between the top surface TS1 and a tangent plane PL1 to the first curved sidewall CS1 near the position where the first curved sidewall CS1 is directly connected with the top surface TS1, and the included angle between the bottom surface BS1 and the first curved sidewall CS1 may include an included angle A2 between the bottom surface BS1 and a tangent plane PL2 to the first curved sidewall CS1 near the position where the first curved sidewall CS1 is directly connected with the bottom surface BS1, but not limited thereto. The included angle between the top surface TS1 and the tangent plane to the first curved sidewall CS1 and the included angle between the bottom surface BS1 and the tangent plane to the first curved sidewall CS1 will vary depending on the position of the tangent plane, but the included angle between the top surface TS1 and the tangent plane will be less than 90 degrees, and the included angle between the bottom surface BS1 and the tangent plane will be greater than 90 degrees. In addition, the portion where the first curved sidewall CS1 is directly connected with the top surface TS1 may be regarded as a tip of the field plate FP, and the distance between the tip and the III-V compound semiconductor layer 12 in the direction D1 may be increased by the design described above for improving the corona effect under the condition that the field plate FP is used to achieve the effect described above. The electrical performance of the semiconductor device 100 (such as the breakdown voltage of the semiconductor device 100, but not limited thereto) and/or the product reliability may be improved accordingly.

In some embodiments, the field plate FP may be an electrically conductive structure, such as a metallic electrically conductive structure made of a single layer or multiple layers of metallic conductive materials, but not limited thereto. For example, the field plate FP may include a single layer of metallic conductive material (such as titanium nitride) or stacked layers of metallic conductive materials (such as a three-layer structure made of titanium nitride, aluminum, and titanium nitride). In some embodiments, the field plate FP may be directly connected with the gate structure GE, and a material composition of the field plate FP may be identical to a material composition of the gate structure GE. For example, the field plate FP and the gate structure are formed of the same electrically conductive material layer 40, but not limited thereto. Additionally, in some embodiments, the relative position of the field plate FP in the direction D1 and/or the direction D2 may be modified for making the field plate FP have the desired effect in the semiconductor device 100, and the top surface TS1 of the field plate FP may be lower than a top surface TS2 of the gate structure GE in the direction D1 accordingly, but not limited thereto.

In some embodiments, the semiconductor device 100 may further include a source structure SE disposed above the III-V compound semiconductor layer 12, and at least a portion of the source structure SE and at least a portion of the drain structure DE may be located at two opposite sides of the gate structures in the direction D2, respectively. One end of the gate structure GE in the direction D2 may be directly connected with the field plate FP, and another end of the gate structure GE in the direction D2 may be regarded as an edge of the gate structure GE adjacent to the source structure SE. In some embodiments, the gate structure GE may include a second curved sidewall CS2 located at the edge of the gate structure GE adjacent to the source structure SE, and the shape and related characteristics of the second curved sidewall CS2 may be similar to those of the first curved sidewall CS1 described above, but not limited thereto. For example, the second curved sidewall CS2 may be concave towards the top surface TS2 of the gate structure GE, the top surface TS2 may be the topmost surface of the gate structure GE in the direction D1, and the second curved sidewall CS2 may be directly connected with the top surface TS2 at the edge of the gate structure GE. In addition, the second curved sidewall CS2 may be directly connected with the top surface TS2 at the upper portion of the edge of the gate structure GE adjacent to the source structure SE, the second curved sidewall CS2 may be directly connected with a lower surface of the gate structure at the lower portion of the edge of the gate structure GE adjacent to the source structure SE, and a distance between the source structure SE and the upper portion of the edge of the gate structure GE in the direction D2 may be less than a distance between the source structure SE and the lower portion of the edge of the gate structure GE in the direction D2, but not limited thereto.

The substrate 10 may include a silicon substrate, a silicon carbide substrate, a gallium nitride (GaN) substrate, a sapphire substrate, or a substrate made of other suitable materials, and the III-V compound semiconductor layer 12 may include gallium nitride, indium gallium nitride (InGaN), or other suitable III-V compound semiconductor materials. The source structure SE and the drain structure DE may include a barrier layer (not illustrated) and a metal layer (not illustrated) disposed on the barrier layer, but not limited thereto. In some embodiments, the source structure SE and the drain structure DE may further include another barrier layer disposed on the metal layer described above. The barrier layer described above may include titanium, titanium nitride, tantalum, tantalum nitride, or other suitable electrically conductive barrier materials, and the metal layer described above may include tungsten, copper, aluminum, titanium aluminum alloy, aluminum copper alloy, or other suitable metallic electrically conductive materials. In some embodiments, a buffer layer (not illustrated) may be disposed between the substrate 10 and the III-V compound semiconductor layer 12, and the buffer layer may include gallium nitride, aluminum gallium nitride (AlGaN), aluminum indium nitride (AlInN), or other suitable buffer materials.

In some embodiments, the semiconductor device 100 may further include a III-V compound barrier layer 14, an isolation structure 16, a p-type doped III-V compound layer 20, a barrier layer 22, a dielectric layer 24, a dielectric layer 26, and a dielectric layer 30. The III-V compound barrier layer 14 may be disposed on the III-V compound semiconductor layer 12, and the III-V compound barrier layer 14 may include aluminum gallium nitride, aluminum indium nitride, aluminum gallium indium nitride, aluminum nitride (AlN), or other suitable III-V compound materials. The isolation structure 16 may be at least partially disposed in the III-V compound semiconductor layer 12 and the III-V compound barrier layer 14 for providing an isolation effect, and the isolation structure 16 may include a single layer or multiple layers of insulation materials. The p-type doped III-V compound layer 20 may be disposed on the III-V compound barrier layer 14, the p-type doped III-V compound layer 20 may include p-type doped aluminum gallium nitride, p-type doped gallium nitride, or other suitable p-type doped III-V compound materials, and the p-type dopant in the p-type doped III-V compound layer 20 may include magnesium, beryllium (Be), zinc (Zn), cyclopentadienyl magnesium ($Cp_2Mg$), a combination of the materials described above, or other suitable p-type dopants. The barrier layer 22 may be disposed on the p-type doped III-V compound layer 20, and the barrier layer 22 may include titanium, titanium nitride, tantalum, tantalum nitride, or other suitable electrically conductive barrier materials. The dielectric layer 24 may be disposed conformally on the III-V compound barrier layer 14, the p-type doped III-V compound layer 20, and the barrier layer 22, and the dielectric layer 26 may be disposed conformally on the dielectric layer 24. The dielectric layer 24 may include an oxide dielectric material (such as aluminum oxide) or other suitable dielectric materials, and the dielectric layer 26 may include an oxide dielectric material, such as tetraethoxy silane (TEOS), a nitride dielectric material, or other suitable dielectric materials.

The gate structure GE may penetrate through the dielectric layer 26 and the dielectric layer 24 in the direction D1 for contacting the barrier layer 22, and the gate structure GE may be electrically connected with the p-type doped III-V compound layer 20 via the barrier layer 22, but not limited thereto. In some embodiments, a bottom surface BS2 of the gate structure GE may be directly connected with the barrier layer 22, the bottom surface BS1 of the field plate FP may be higher than the bottom surface BS2 of the gate structure GE in the direction D1, and the bottom surface BS2 may be regarded as the bottommost surface of the gate structure GE in the direction D1, but not limited thereto. The dielectric layer 30 may be disposed on the dielectric layer 26, and the dielectric layer 30 may include multiple layers of dielectric materials, such as tetraethoxy silane, silicon oxide, silicon nitride, or other suitable dielectric materials. In some embodiments, at least a portion of the gate structure GE may be regarded as being disposed in the dielectric layer 30, a portion of the dielectric layer 30 may cover the gate structure GE in the direction D1, and the source structure SE and the drain structure DE may penetrate through the dielectric layer 30, the dielectric layer 26, the dielectric layer 24, and the III-V compound barrier layer 14 in the direction D1 for being partially disposed in the III-V compound semiconductor layer 12, but not limited thereto.

Figure 2:
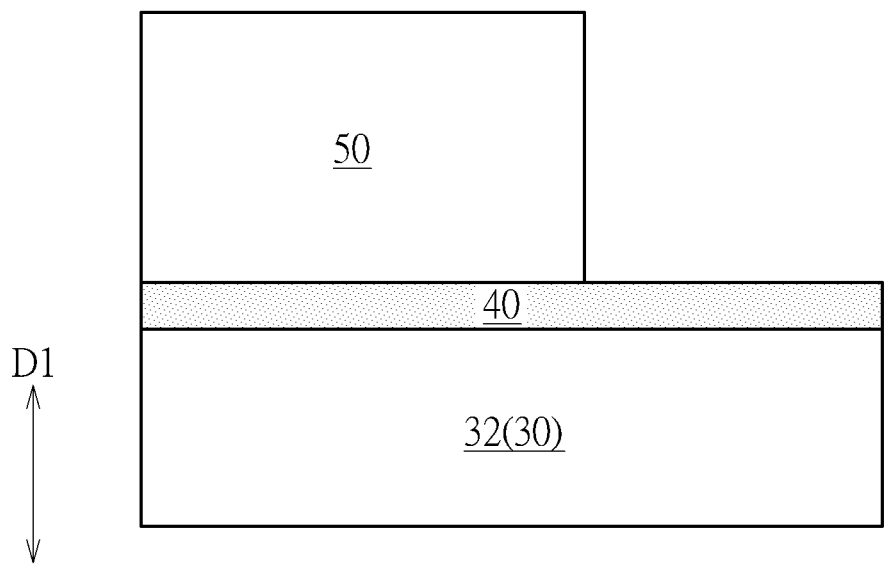
Figure 3:
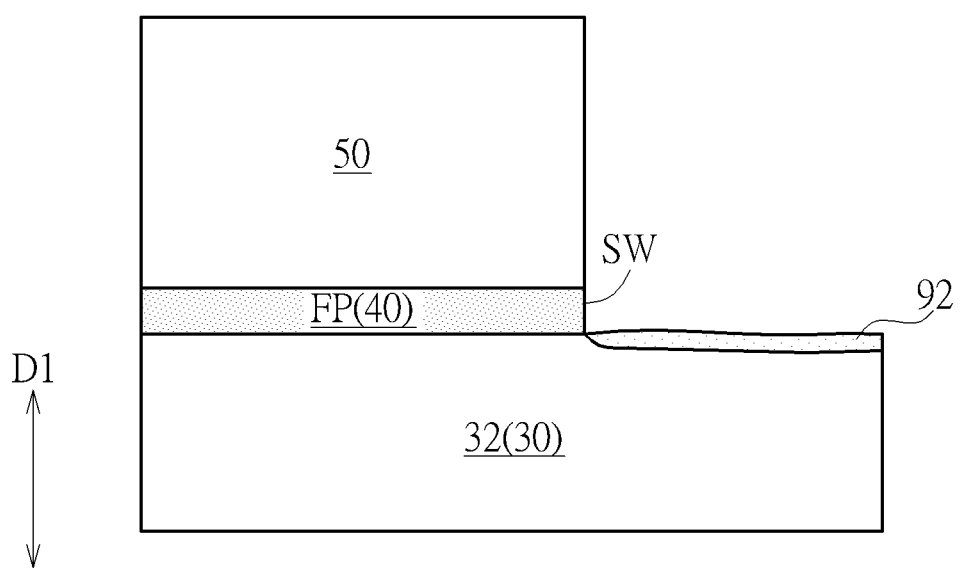
Figure 4:
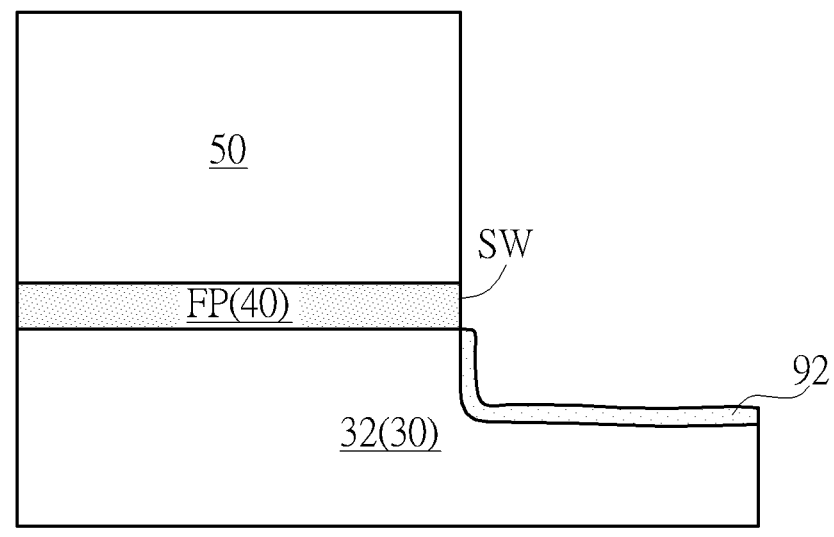

Please refer to FIGS. 1-5. FIGS. 2-5 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. In some embodiments, FIGS. 2-5 may be regarded as schematic drawings illustrating a manufacturing method of the field plate in the semiconductor device, but not limited thereto. As shown in FIG. 1, the manufacturing method of the semiconductor device 100 in this embodiment may include the following steps. The III-V compound semiconductor layer 12 is formed on the substrate 10. The gate structure GE, the field plate FP, and the drain structure DE are formed above the III-V compound semiconductor layer 12. The field plate FP is located between the gate structure GE and the drain structure DE, and the field plate FG includes the first curved sidewall CS1 located at an edge of the field plate FP adjacent to the drain structure DE.

Specifically, the manufacturing method of the semiconductor device 100 in this embodiment may include but is not limited to the following steps. The III-V compound semiconductor layer 12 may be formed on the top surface 10TS of the substrate 10, and the III-V compound barrier layer 14 may be formed on the III-V compound semiconductor layer 12. In some embodiments, at least a part of the isolation structure 16 may be formed in the III-V compound semiconductor layer 12 and the III-V compound barrier layer 14 for providing the isolation effect and/or defining an active region corresponding to the semiconductor device 100. The p-type doped III-V compound layer 20 may be formed on the III-V compound barrier layer 14, and the barrier layer 22 may be formed on the p-type doped III-V compound layer 20. The dielectric layer 24 may be formed conformally on the III-V compound barrier layer 14, the p-type doped III-V compound layer 20, and the barrier layer 22, and the dielectric layer 26 may be formed conformally on the dielectric layer 24. In addition, a portion of the dielectric layer 30 (such as a dielectric layer 32 illustrated in FIG. 2) may be formed on the dielectric layer 26, and the gate structure GE and the field plate FP described above may be formed after this portion of the dielectric layer 30 is formed.

In some embodiments, a method of forming the field plate FP may include but is not limited to the following steps. As shown in FIG. 2, the electrically conductive material layer 40 may be formed on the dielectric layer 32, and a patterned photoresist layer 50 may be formed on the electrically conductive material layer 40. Subsequently, as shown in FIG. 3, an etching process 90 using the patterned photoresist layer 50 as an etching mask may be performed to the electrically conductive material layer 40, and a portion of the electrically conductive material layer 40 may be patterned to be the field plate FP by the etching process 90. In some embodiments, an etchant used in the etching process 90 may include fluorine, but not limited thereto. For example, the etching process 90 may include a dry etching process, and a reactive gas used in the dry etching process may include carbon tetrafluoride ($CF_4$), octafluorocyclobutane ($C_4F_8$), or other suitable reactive gases including fluorine. Additionally, a by-product 92 may be formed in the etching process 90, and the by-product 92 may accumulate on the surface of the dielectric layer 32 and contact a sidewall SW of the field plate FP. The by-product 92 may include a fluorine containing by-product, especially when the etchant used in the etching process 90 includes fluorine, but not limited thereto.

As shown in FIG. 3 and FIG. 4, in some embodiments, a portion of the dielectric layer 32 may be removed by the etching process 90, and this condition may be regarded as being generated by an over etching design. The over etching design may be used to ensure that a portion of the electrically conductive material layer 40 can be completely removed by the etching process 90 for forming the field plate FP. In some embodiments, more by-products 92 may be generated by the over etching design described above for increasing the chance of contacting the field plate FP with the by-products 92, and the by-product 92 may contact the sidewall SW of the field plate FP for reacting with the sidewall SW of the field plate FP. As shown in FIG. 4 and FIG. 5, in some embodiments, the by-product 92 may be accumulated upwards from the surface of the dielectric layer 32 and contact the lower part of the sidewall SW of the field plate FP first, and the sidewall SW of the field plate FP may be etched by the by-product 92 to become the first curved sidewall CS1 described above. Additionally, after the etching process 90, the patterned photoresist layer 50 and the by-products 92 may be removed. As shown in FIG. 4, FIG. 5, and FIG. 1, in some embodiments, the electrically conductive material layer 40 may be patterned by the etching process 90 for forming the field plate FP and the gate structure GE concurrently. Therefore, a portion of the electrically conductive material layer 40 may be patterned by the etching process 90 to become the field plate FP having the first curved sidewall CS1, another portion of the electrically conductive material layer 40 may be patterned by the etching process 90 to become the gate structure GE having the second curved sidewall CS2, and a method of forming the second curved sidewall CS2 may be the same as the method of forming the first curved sidewall CS1 described above, but not limited thereto. It is worth noting that, in this invention, the method of forming the field plate FP having the first curved sidewall CS1 is not limited to the method shown in FIGS. 2-5 described above, and other suitable approaches may be applied for forming the field plate FP having the first curved sidewall CS1 illustrated in FIG. 1 according to other design considerations.

As shown in FIG. 5 and FIG. 1, after the step of forming the field plate FP having the first curved sidewall CS1, other portions of the dielectric layer 30 (such as portions except the dielectric layer 32), the source structure SE, and the drain structure DE may be formed. In some embodiments, the source structure SE and the drain structure DE may be formed above the III-V compound semiconductor layer 12 and penetrate through the dielectric layer 30, the dielectric layer 26, the dielectric layer 24, and the III-V compound barrier layer 14 in the direction D1, but not limited thereto.

To summarize the above descriptions, in the semiconductor device and the manufacturing method thereof according to the present invention, the field plate including the curved sidewall may be formed for improving the electric field distribution in the semiconductor device and/or improving problems, such as corona effect, while maintaining the function of the field plate. The electrical performance of the semiconductor device and/or the product reliability may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a III-V compound semiconductor layer disposed on the substrate;
   a gate structure disposed above the III-V compound semiconductor layer;
   a drain structure disposed above the III-V compound semiconductor layer;
   a field plate disposed above the III-V compound semiconductor layer and located between the gate structure and the drain structure, wherein the field plate comprises a first curved sidewall located at an edge of the field plate adjacent to the drain structure; and
   an electrically conductive barrier layer disposed under the gate structure, wherein the gate structure is directly connected with the field plate and the electrically conductive barrier layer, and a material composition of the gate structure directly connected with the electrically conductive barrier layer is identical to a material composition of the field plate,
   wherein the first curved sidewall is directly connected with a top surface of the field plate at a first portion of the field plate, the first curved sidewall is directly connected with a bottom surface of the field plate at a second portion of the field plate, and a distance between the first portion of the field plate and the drain structure in a horizontal direction is less than a distance between the second portion of the field plate and the drain structure in the horizontal direction,
   wherein the first curved sidewall is concave towards the top surface of the field plate.

2. The semiconductor device according to claim 1 wherein an included angle between the top surface of the field plate and the first curved sidewall is less than an included angle between the bottom surface of the field plate and the first curved sidewall.

3. The semiconductor device according to claim 1, further comprising:
   a source structure disposed above the III-V compound semiconductor layer, wherein the gate structure comprises a second curved sidewall located at an edge of the gate structure adjacent to the source structure.

4. The semiconductor device according to claim 3, wherein the second curved sidewall is concave towards a top surface of the gate structure.

5. The semiconductor device according to claim 1, wherein the top surface of the field plate is lower than a top surface of the gate structure in a vertical direction.

6. The semiconductor device according to claim 1, wherein the field plate is a metallic electrically conductive structure.

7. A manufacturing method of a semiconductor device, comprising:
   forming a III-V compound semiconductor layer on a substrate;
   forming a gate structure above the III-V compound semiconductor layer;
   forming a field plate above the III-V compound semiconductor layer; and
   forming a drain structure above the III-V compound semiconductor layer, wherein the field plate is located between the gate structure and the drain structure, and the field plate comprises a first curved sidewall located at an edge of the field plate adjacent to the drain structure,
   wherein a method of forming the field plate comprises:
      performing an etching process to an electrically conductive material layer, wherein a portion of the electrically conductive material layer is patterned to be the field plate by the etching process, and an etchant used in the etching process comprises fluorine,
      wherein a fluorine containing by-product is formed in the etching process, and a sidewall of the field plate is etched by the fluorine containing by-product to become the first curved sidewall.

8. The manufacturing method of the semiconductor device according to claim 7, wherein another portion of the electrically conductive material layer is patterned to be the gate structure by the etching process.

9. The manufacturing method of the semiconductor device according to claim 7, wherein the first curved sidewall is concave towards a top surface of the field plate.

10. The manufacturing method of the semiconductor device according to claim 7, wherein the first curved sidewall is directly connected with a top surface of the field plate at a first portion of the field plate, and the first curved sidewall is directly connected with a bottom surface of the field plate at a second portion of the field plate.

11. The manufacturing method of the semiconductor device according to claim 10, wherein an included angle between the top surface and the first curved sidewall is less than an included angle between the bottom surface and the first curved sidewall.

12. The manufacturing method of the semiconductor device according to claim 10, wherein a distance between the first portion of the field plate and the drain structure in a horizontal direction is less than a distance between the second portion of the field plate and the drain structure in the horizontal direction.

13. The manufacturing method of the semiconductor device according to claim 7, further comprising:
   forming a source structure above the III-V compound semiconductor layer, wherein the gate structure comprises a second curved sidewall located at an edge of the gate structure adjacent to the source structure.

14. The manufacturing method of the semiconductor device according to claim 13, wherein the second curved sidewall is concave towards a top surface of the gate structure.

* * * * *